(12) United States Patent
Ikeuchi

(10) Patent No.: US 11,706,854 B2
(45) Date of Patent: Jul. 18, 2023

(54) LED DRIVE CONTROL CIRCUITRY, ELECTRONIC CIRCUITRY, AND LED DRIVE CONTROL METHOD

(71) Applicants: Kabushiki Kaisha Toshiba, Tokyo (JP); Toshiba Electronic Devices & Storage Corporation, Tokyo (JP)

(72) Inventor: Katsuyuki Ikeuchi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/560,866

(22) Filed: Dec. 23, 2021

(65) Prior Publication Data

US 2022/0117055 A1    Apr. 14, 2022

Related U.S. Application Data

(62) Division of application No. 16/999,231, filed on Aug. 21, 2020, now Pat. No. 11,246,200.

(30) Foreign Application Priority Data

Sep. 19, 2019   (JP) .................................. 2019-170591

(51) Int. Cl.
*H05B 45/305*    (2020.01)
*H05B 45/10*    (2020.01)
(Continued)

(52) U.S. Cl.
CPC .......... *H05B 45/305* (2020.01); *H03M 3/464* (2013.01); *H04L 7/0037* (2013.01);
(Continued)

(58) Field of Classification Search
CPC ........ H05B 45/00; H05B 45/10; H05B 45/30; H05B 45/305; H04L 7/00; H04L 7/0016;
(Continued)

(56) References Cited

U.S. PATENT DOCUMENTS 3,902,060 A * 8/1975 Neuner ................ H04B 10/802
250/206
4,061,887 A * 12/1977 Kasson ................... H04M 1/52
379/164

(Continued)

FOREIGN PATENT DOCUMENTS

CN    105406838 A    3/2016
JP    2000-236241 A    8/2000
(Continued)

*Primary Examiner* — James M Perez
(74) *Attorney, Agent, or Firm* — Allen & Overy LLP

(57) ABSTRACT

LED drive control circuitry according to one embodiment outputs an LED drive control signal serving as driving a light emitting diode included in a photocoupler that performs insulation communication in synchronization with a reference clock signal. The LED drive control circuit includes a duty cycle changer that changes a duty cycle of the LED drive control signal in accordance with the reference clock signal and a signal synchronized with the reference clock signal.

6 Claims, 8 Drawing Sheets

(51) Int. Cl.
*H05B 45/30* (2020.01)
*H04L 7/00* (2006.01)
*H03M 3/00* (2006.01)
*F21Y 115/10* (2016.01)

(52) U.S. Cl.
CPC ............ *H05B 45/10* (2020.01); *H05B 45/30* (2020.01); *F21Y 2115/10* (2016.08)

(58) Field of Classification Search
CPC ...... H04L 7/0033; H04L 7/0037; H03M 3/30; H03M 3/458; H03M 3/464; F21Y 2115/10
See application file for complete search history.

(56) References Cited

U.S. PATENT DOCUMENTS

| | | | | |
|---|---|---|---|---|
| 4,081,787 A * | 3/1978 | Lee | ............ | H04L 25/26 375/259 |
| 4,675,575 A * | 6/1987 | Smith | ............ | F21S 4/10 313/499 |
| 4,985,886 A * | 1/1991 | Yomogida | ............ | H04L 12/437 398/41 |
| 5,351,107 A * | 9/1994 | Nakane | ............ | H04N 1/4076 347/132 |
| 5,548,210 A * | 8/1996 | Dittrich | ............ | G01R 31/3278 324/415 |
| 6,018,508 A * | 1/2000 | Hasegawa | ............ | G11B 7/00454 369/116 |
| 6,150,847 A * | 11/2000 | Lu | ............ | H03K 5/1565 326/93 |
| 6,225,751 B1 * | 5/2001 | Komatsu | ............ | H05B 41/295 315/307 |
| 6,323,796 B1 * | 11/2001 | Krone | ............ | H04L 25/0266 341/143 |
| 6,459,670 B1 * | 10/2002 | Kuwahara | ............ | G11B 7/0062 369/59.24 |
| 6,885,249 B2 * | 4/2005 | Suzunaga | ............ | H03G 3/3084 330/308 |
| 7,304,594 B2 * | 12/2007 | Sakura | ............ | H04B 10/1141 341/110 |
| 7,369,067 B2 * | 5/2008 | Kishi | ............ | H03M 5/08 341/71 |
| 7,369,151 B2 * | 5/2008 | Ishikawa | ............ | G06K 15/1219 347/252 |
| 7,385,495 B2 * | 6/2008 | Buhr | ............ | H05B 45/10 340/815.45 |
| 7,449,669 B2 * | 11/2008 | Sakura | ............ | H03F 3/08 250/214 R |
| 7,453,784 B2 * | 11/2008 | Kato | ............ | G11B 7/00456 |
| 7,548,700 B2 * | 6/2009 | Furuya | ............ | H04B 10/66 398/208 |
| 7,580,053 B2 * | 8/2009 | Ishikawa | ............ | G06K 15/1219 347/252 |
| 7,635,837 B2 * | 12/2009 | Uo | ............ | H03F 3/087 250/214 R |
| 7,715,726 B2 * | 5/2010 | Chen | ............ | H03M 3/368 398/154 |
| 7,787,780 B2 * | 8/2010 | Suzunaga | ............ | H03F 3/08 250/214 R |
| 7,915,838 B2 * | 3/2011 | VanEss | ............ | H05B 45/37 341/143 |
| 8,155,537 B2 * | 4/2012 | Saitou | ............ | H04B 10/695 398/208 |
| 8,441,204 B2 * | 5/2013 | Otake | ............ | H05B 45/385 315/360 |
| 8,447,185 B2 * | 5/2013 | Uo | ............ | H04B 10/00 398/155 |
| 8,704,565 B2 * | 4/2014 | Uo | ............ | H03L 7/095 327/158 |
| 8,761,599 B2 * | 6/2014 | Uo | ............ | H04B 10/802 398/189 |
| 9,060,406 B2 * | 6/2015 | Pereira | ............ | H05B 45/14 |
| 9,077,352 B2 * | 7/2015 | Uo | ............ | H03L 7/0816 |
| 9,155,144 B2 * | 10/2015 | Mitterbacher | ............ | H05B 45/50 |
| 9,173,107 B2 * | 10/2015 | Shimizu | ............ | H03M 3/368 |
| 9,270,237 B2 * | 2/2016 | Imai | ............ | H03F 3/082 |
| 9,306,662 B1 * | 4/2016 | Hematy | ............ | H04B 10/802 |
| 9,433,041 B2 * | 8/2016 | Mitterbacher | ............ | H05B 45/00 |
| 9,479,325 B1 * | 10/2016 | Hematy | ............ | H04B 10/00 |
| 9,736,901 B2 * | 8/2017 | Zhao | ............ | H05B 45/10 |
| 9,877,361 B2 * | 1/2018 | Williams | ............ | A61N 5/06 |
| 10,039,171 B1 * | 7/2018 | Li | ............ | H05B 45/14 |
| 10,314,124 B1 * | 6/2019 | Yang | ............ | H05B 47/20 |
| 10,575,377 B2 * | 2/2020 | Eum | ............ | H05B 45/325 |
| 10,673,478 B2 * | 6/2020 | Harada | ............ | H03K 5/00 |
| 10,862,544 B2 * | 12/2020 | Ikeuchi | ............ | H04L 25/0266 |
| 10,999,906 B1 * | 5/2021 | Lan | ............ | H05B 45/325 |
| 11,006,488 B2 * | 5/2021 | Williams | ............ | A61N 5/06 |
| 11,171,648 B2 * | 11/2021 | Ikeuchi | ............ | H03K 17/302 |
| 11,246,200 B2 * | 2/2022 | Ikeuchi | ............ | H04L 25/0266 |
| 11,432,387 B2 * | 8/2022 | Saes | ............ | F21S 2/005 |
| 11,483,001 B2 * | 10/2022 | Ikeuchi | ............ | H03K 19/17784 |
| 11,502,608 B2 * | 11/2022 | Aoki | ............ | H05B 45/395 |
| 2005/0219354 A1 * | 10/2005 | Omori | ............ | H04N 1/053 347/250 |
| 2006/0083011 A1 * | 4/2006 | Buhr | ............ | H05B 45/10 362/466 |
| 2006/0187979 A1 * | 8/2006 | Ishikawa | ............ | G06K 15/1219 372/38.1 |
| 2006/0279438 A1 * | 12/2006 | Kishi | ............ | H03M 5/08 341/51 |
| 2007/0075886 A1 * | 4/2007 | Sakura | ............ | H04B 14/026 341/143 |
| 2008/0186376 A1 * | 8/2008 | Ishikawa | ............ | G06K 15/1219 347/252 |
| 2008/0292325 A1 * | 11/2008 | Chen | ............ | H03M 1/0827 341/137 |
| 2009/0018458 A1 * | 1/2009 | Cao | ............ | A61B 5/30 600/509 |
| 2009/0073626 A1 * | 3/2009 | Saitou | ............ | G01R 31/2635 250/551 |
| 2009/0108769 A1 * | 4/2009 | Ishikita | ............ | H05B 41/28 315/291 |
| 2010/0259179 A1 * | 10/2010 | Bowling | ............ | H05B 41/3927 315/224 |
| 2011/0075525 A1 * | 3/2011 | Kimura | ............ | G11B 5/02 |
| 2011/0084991 A1 * | 4/2011 | Yu | ............ | H05B 41/2828 345/102 |
| 2011/0188864 A1 * | 8/2011 | Uo | ............ | H04B 10/00 398/154 |
| 2012/0133295 A1 * | 5/2012 | Pereira | ............ | H05B 45/10 315/210 |
| 2012/0229946 A1 * | 9/2012 | Shirakawa | ............ | H03K 17/7955 361/91.1 |
| 2012/0303324 A1 * | 11/2012 | Nakatani | ............ | G05B 19/058 702/183 |
| 2013/0039648 A1 * | 2/2013 | Uo | ............ | H04B 10/802 398/25 |
| 2013/0182595 A1 * | 7/2013 | Shimizu | ............ | G01D 21/00 370/252 |
| 2013/0214835 A1 * | 8/2013 | Uo | ............ | H03L 7/095 327/157 |
| 2014/0128941 A1 * | 5/2014 | Williams | ............ | A61N 5/06 315/193 |
| 2014/0153935 A1 * | 6/2014 | Uo | ............ | H03L 7/183 327/107 |
| 2014/0333144 A1 * | 11/2014 | Ikeuchi | ............ | H02J 50/90 307/104 |
| 2014/0339905 A1 * | 11/2014 | Moritsuka | ............ | B60L 53/124 307/104 |
| 2014/0368122 A1 * | 12/2014 | Mitterbacher | ............ | H02M 3/156 315/224 |
| 2015/0084544 A1 * | 3/2015 | Mitterbacher | ............ | H05B 45/3725 315/294 |
| 2015/0132006 A1 * | 5/2015 | Inoue | ............ | G03B 21/2033 398/118 |
| 2015/0257230 A1 * | 9/2015 | Lee | ............ | H05B 47/105 315/186 |

(56) References Cited

U.S. PATENT DOCUMENTS

| | | | |
|---|---|---|---|
| 2015/0270727 A1* | 9/2015 | Fukute | H02J 7/0042 |
| | | | 320/107 |
| 2016/0050733 A1* | 2/2016 | Joo | H05B 45/20 |
| | | | 315/158 |
| 2016/0105939 A1* | 4/2016 | Lee | H05B 45/20 |
| | | | 315/201 |
| 2017/0039161 A1* | 2/2017 | Gauthier, Jr. | G06F 13/4282 |
| 2017/0111969 A1* | 4/2017 | Zhao | H05B 45/10 |
| 2017/0215240 A1* | 7/2017 | Sawada | H02M 3/33523 |
| 2018/0145672 A1* | 5/2018 | Shimizu | H03K 17/14 |
| 2018/0146520 A1* | 5/2018 | Williams | H05B 45/24 |
| 2019/0141802 A1* | 5/2019 | Saes | F21S 2/005 |
| 2019/0155199 A1* | 5/2019 | Saito | G03G 15/5004 |
| 2019/0159308 A1* | 5/2019 | Eum | H05B 45/325 |
| 2020/0075225 A1* | 3/2020 | Ikeuchi | H01F 38/14 |
| 2020/0076478 A1* | 3/2020 | Ikeuchi | H01F 38/14 |
| 2020/0187328 A1* | 6/2020 | Chen | H05B 45/46 |
| 2020/0245430 A1* | 7/2020 | Wen | H05B 45/325 |
| 2021/0092813 A1* | 3/2021 | Ikeuchi | H05B 45/10 |
| 2021/0100082 A1* | 4/2021 | Aoki | H05B 45/305 |
| 2021/0258011 A1* | 8/2021 | Ikeuchi | H03K 17/302 |
| 2021/0328588 A1* | 10/2021 | Ikeuchi | H03K 17/302 |
| 2022/0117055 A1* | 4/2022 | Ikeuchi | H04L 7/0037 |
| 2022/0291707 A1* | 9/2022 | Ikeuchi | G05F 3/30 |
| 2022/0416667 A1* | 12/2022 | Aoki | H05B 45/375 |

FOREIGN PATENT DOCUMENTS

| | | |
|---|---|---|
| JP | 2007-104106 A | 4/2007 |
| JP | 2009-081829 A | 4/2009 |
| JP | 2014-090257 A | 5/2014 |
| JP | 2014-110491 A | 6/2014 |

* cited by examiner

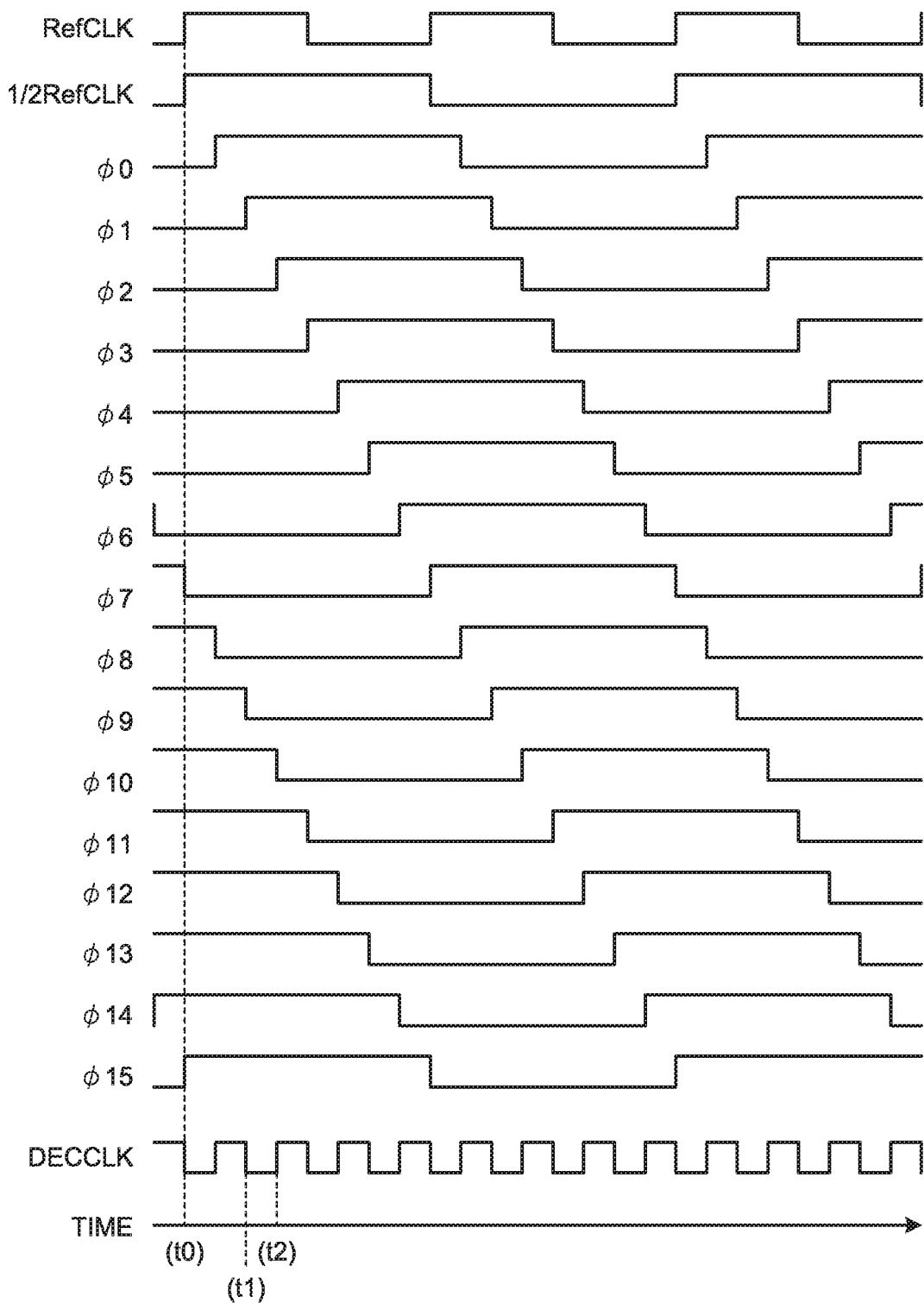

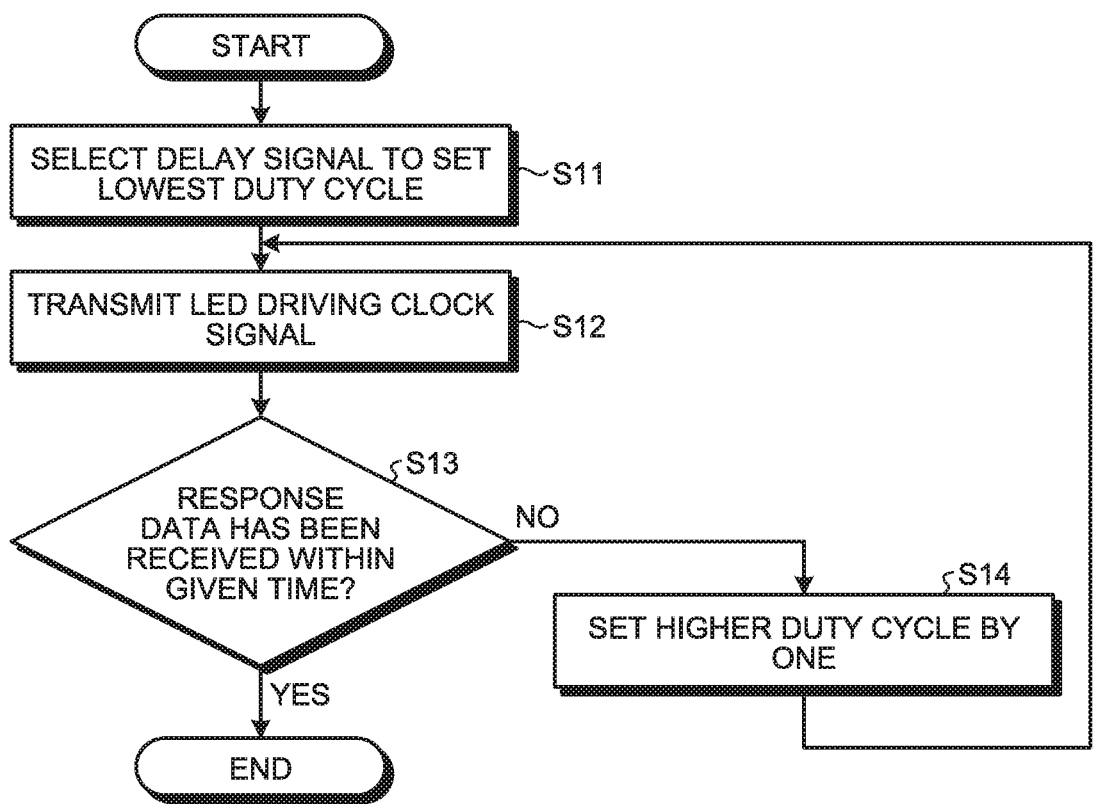

LED DRIVE CONTROL CIRCUITRY, ELECTRONIC CIRCUITRY, AND LED DRIVE CONTROL METHOD

CROSS-REFERENCE TO RELATED APPLICATIONS

This application is a divisional of U.S. application Ser. No. 16/999,231 filed on Aug. 21, 2020 and is based upon and claims the benefit of priority from Japanese Application No. 2019-170591, filed on Sep. 19, 2019, the entire contents of which are incorporated herein by reference.

FIELD

Embodiments described herein relate generally to LED drive control circuitry, electronic circuitry, and an LED drive control method.

BACKGROUND

Traditionally, a higher-voltage circuit and a lower-voltage circuit are connected through a photocoupling circuit for insulation purpose. For example, an isolation amplifier serves to receive and amplify an input signal from a sensing-target device included in a higher-voltage circuit (primary circuitry) and transmits the resultant signal to a lower-voltage circuit (secondary circuitry). For signal transmission, the isolation amplifier receives a clock signal from the lower-voltage circuit through a light emitting diode (LED) constituting a photocoupler, and performs analog to digital conversion of the clock signal to regenerate a clock signal therefrom and transmit a signal to the lower-voltage circuit in accordance with the regenerated clock signal. The lower-voltage circuit performs signal processing in accordance with a processing clock synchronized with the clock signal transmitted to the higher-voltage circuit.

Light emitting diodes for use in signal transmission are single-phase circuits, therefore, they vary in longevity and current consumption depending on the lighting time. In terms of operability, reliability, and maintenance, light emitting diodes are desirable to be lower in power consumption and longer in longevity.

It is thus preferable to provide an LED drive control circuit, electronic circuitry, and an LED drive control method that can lower power consumption and prolong the longevity of light emitting diodes.

BRIEF DESCRIPTION OF THE DRAWINGS

FIG. 7 is a signal timing chart at the time of generating the LED driving clock signal;
and
FIG. 8 is a flowchart of processing according to a third embodiment.

DETAILED DESCRIPTION

According to one embodiment, in general, LED drive control circuitry outputs an LED drive control signal serving to drive a light emitting diode included in a photocoupler. The photocoupler performs insulation communication in synchronization with a reference clock signal. The LED drive control circuit includes a duty cycle changer that changes a duty cycle of the LED drive control signal in accordance with the reference clock signal and a signal synchronized with the reference clock signal.

Exemplary embodiments will be explained below with reference to the accompanying drawings. The following will describe a detection monitoring system including an isolation amplifier with a photocoupler, as an example.

Figure 1:
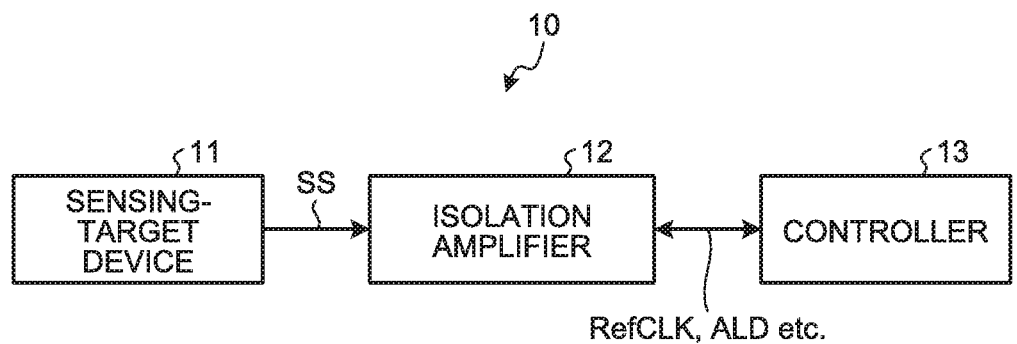
FIG. 1 is a schematic configuration block diagram of a detection monitoring system according to an embodiment.

FIG. 1 is a schematic configuration block diagram of a detection monitoring system according to an embodiment. A detection monitoring system 10 includes a sensing-target device 11, an isolation amplifier 12, and a controller 13. The sensing-target device 11 serves as an AC three-phase motor, for example, and outputs a sensing output signal. The isolation amplifier 12 receives and amplifies the sensing output signal SS from the sensing-target device 11, to transmit monitoring data ALD in an insulated state. The controller 13 monitors the state of the sensing-target device 11 through the isolation amplifier 12. As configured above, the sensing-target device 11 serves as a higher-voltage circuit, and the controller 13 serves as a lower-voltage circuit.

Figure 2:
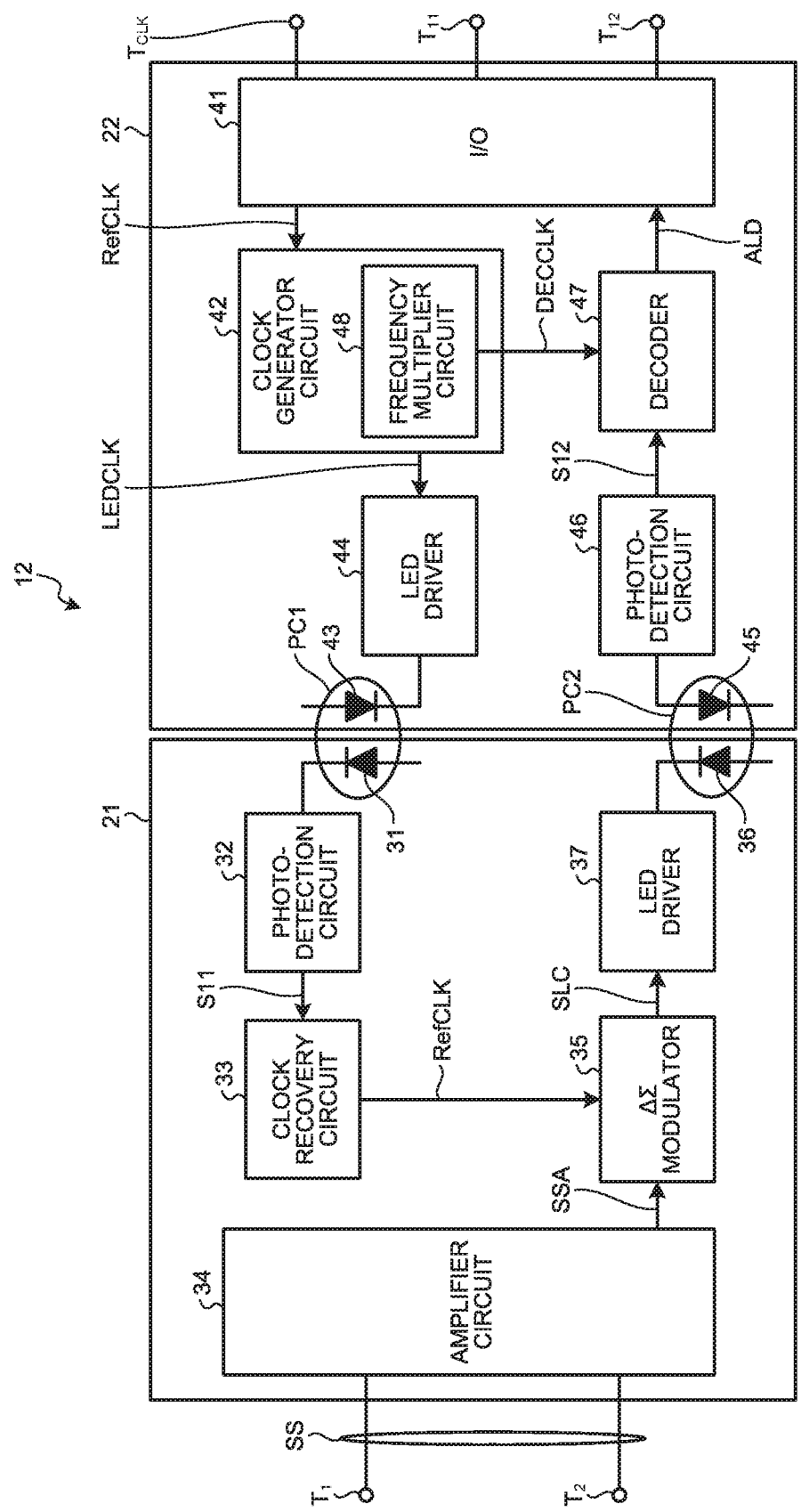
FIG. 2 is a schematic configuration block diagram of an isolation amplifier.

FIG. 2 is a schematic configuration block diagram of the isolation amplifier. The isolation amplifier 12 includes a primary circuit 21 equipped with input terminals $T_1$ and $T_2$ connected to the sensing-target device 11, and a secondary circuit 22 equipped with a clock terminal $T_{CLK}$ and input/output terminals $T_1$ and $T_{12}$ that are connected to the controller 13. The secondary circuit 22 is connected in an insulated state to the primary circuit 21 through a photocoupler PC1.

The primary circuit 21 includes a photodetector 31, a photodetection circuit 32, a clock recovery circuit 33, an amplifier circuit 34, a delta-sigma ($\Delta\Sigma$) modulator 35, a light emitting diode (LED) 36, and an LED driver 37. The photodetector 31 constitutes the photocoupler PC1. The photodetection circuit 32 processes an input signal from the photodetector 31 to output a photodetection signal S11 to the clock recovery circuit 33. The clock recovery circuit 33 receives the photodetection signal S11 and recovers a reference clock signal RefCLK from the photodetection signal S11 for output to the $\Delta\Sigma$ modulator 35. The amplifier circuit 34 receives and amplifies the sensing output signal SS from the sensing-target device 11 through the input terminals $T_1$ and $T_2$ to output an amplified sensing output signal SSA. The $\Delta\Sigma$ modulator 35 performs delta/sigma modulation of the amplified sensing output signal SSA with reference to the reference clock signal RefCLK output from the clock recovery circuit 33, to output an LED control signal SLC. The LED driver 37 drives the LED 36 constituting a photocoupler PC2 by the LED control signal SLC.

The secondary circuit 22 includes an input/output (I/O) 41, a clock generator circuit 42, a light emitting diode (LED) 43, an LED driver 44, a photodetector 45, a photodetection circuit 46, and a decoder 47. The input/output 41 is connected to the clock terminal $T_{CLK}$ and the input/output terminals $T_1$ and $T_{12}$ for input/output interfacing. The clock generator circuit 42 receives the reference clock signal RefCLK through the input/output 41 to generate an LED driving clock signal LEDCLK with reference to the reference clock signal RefCLK and output the signal to the LED driver 44. The clock generator circuit 42 also generates a decoder clock signal DECCLK in accordance with the reference clock signal RefCLK for output to the decoder 47. The LED driver 44 receives the LED driving clock signal LEDCLK and drives the LED 43 of the photocoupler PC1 in accordance with the LED driving clock signal LEDCLK. The photodetection circuit 46 processes an input signal from the photodetector 45 of the photocoupler PC2 to output a photodetection signal S12. The decoder 47 receives the decoder clock signal DECCLK and decodes the photodetection signal S12 with reference to the decoder clock signal DECCLK to output monitoring data ALD to the controller 13 through the input/output 41 and the input/output terminals $T_1$ and $T_{12}$.

In the configuration as above, the clock generator circuit 42 includes a frequency multiplier circuit 48 that multiplies the frequency of the reference clock signal RefCLK or a frequency divided signal of the reference clock signal RefCLK to generate the decoder clock signal DECCLK. Further, the clock generator circuit 42 functions as a duty cycle changer.

A schematic operation of the isolation amplifier is now described prior to a specific operation.

In response to receipt of the reference clock signal RefCLK through the clock terminal $T_{CLK}$ and the input/output 41, the clock generator circuit 42 of the secondary circuit 22 of the isolation amplifier 12 generates the LED driving clock signal LEDCLK for output to the LED driver 44. The clock generator circuit 42 generates the decoder clock signal DECCLK for output to the decoder 47. The LED driver drives the LED 43 of the photocoupler PC1 in accordance with the LED driving clock signal LEDCLK to transmit, in an insulated state, the LED driving clock signal LEDCLK to the primary circuit 21.

Consequently, the photodetection circuit 32 of the primary circuit 21 processes an input signal from the photodetector 31 of the photocoupler PC1 to output the photodetection signal S11 to the clock recovery circuit 33. The clock recovery circuit 33 recovers the reference clock signal RefCLK with reference to the photodetection signal S11 for output to the ΔΣ modulator 35.

Concurrently, the amplifier circuit 34 receives and amplifies the sensing output signal SS from the sensing-target device 11 through the input terminals $T_1$ and $T_2$ to output the amplified sensing output signal SSA to the ΔΣ modulator 35.

As a result, the ΔΣ modulator 35 performs delta-sigma modulation of the amplified sensing output signal SSA in accordance with the reference clock signal RefCLK from the clock recovery circuit 33, and outputs the LED control signal SLC to the LED driver 37. The LED driver 37 drives the LED 36 of the photocoupler PC2 in accordance with the LED control signal SLC, to transmit the signal to the secondary circuit 22.

The photodetection circuit 46 of the secondary circuit 22 processes an input signal from the photodetector 45 of the photocoupler PC2 to output the photodetection signal S12 to the decoder 47.

The decoder 47 decodes the photodetection signal S12 in accordance with the decoder clock signal DECCLK to output monitoring data ALD to the controller 13 through the input/output 41 and the input/output terminals $T_1$ and $T_{12}$.

Consequently, the isolation amplifier 12 can perform signal transmission in an insulated state from the sensing-target device 11 to the controller 13 in synchronization with the reference clock signal RefCLK input from the controller 13.

First Embodiment

The following will describe an operation according to a first embodiment. In the first embodiment, the frequency multiplier circuit 48 multiplies the reference clock signal RefCLK by four to generate the decoder clock signal DECCLK, by way of example.

Figure 3:
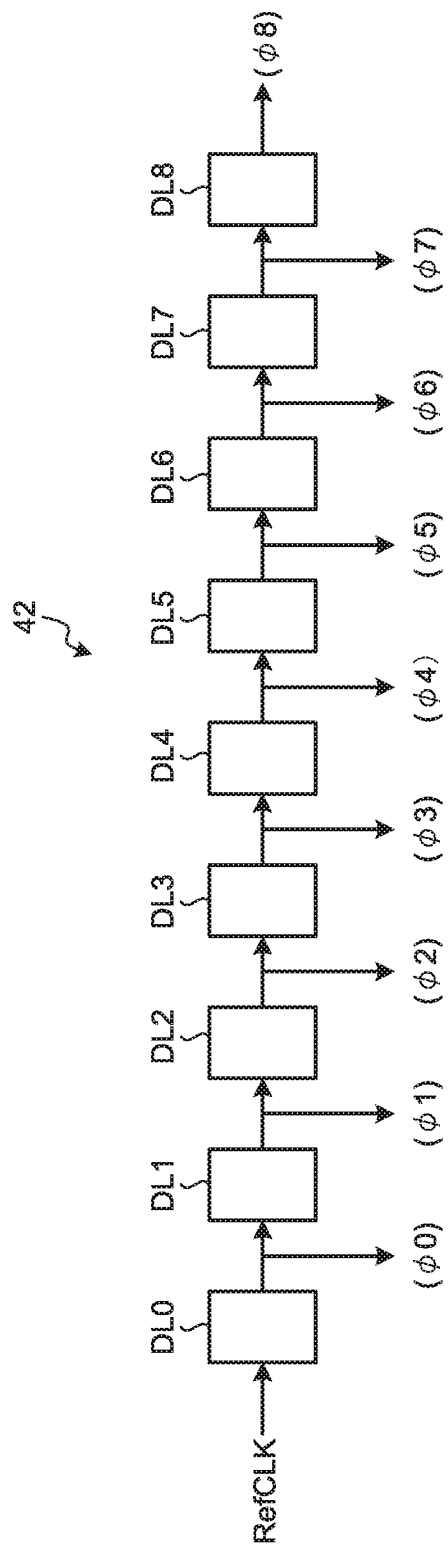
FIG. 3 is a function diagram of a clock generator circuit according to a first embodiment.

FIG. 3 is a function diagram of a clock generator circuit according to the first embodiment.

The clock generator circuit 42 includes delay circuits DL0 to DL8, each of which applies, to the input reference clock signal RefCLK, amount of delay corresponding to timing between the rising edge and the falling edge of the decoder clock signal DECCLK. The delay circuits DL0 to DL8 output delay signals φ0 to φ8, respectively.

Figure 4A:
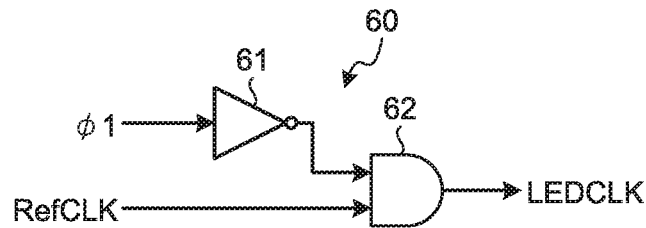
FIGS. 4A to 4C illustrate generation of an LED driving clock signal in the first embodiment, by way of example.
Figure 4B:
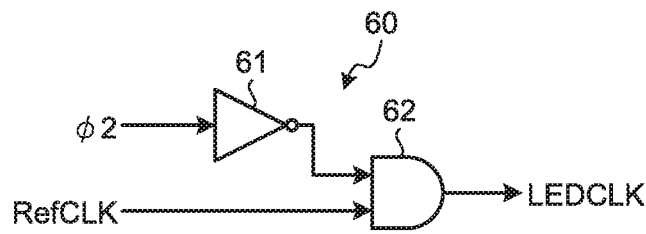
Figure 4C:
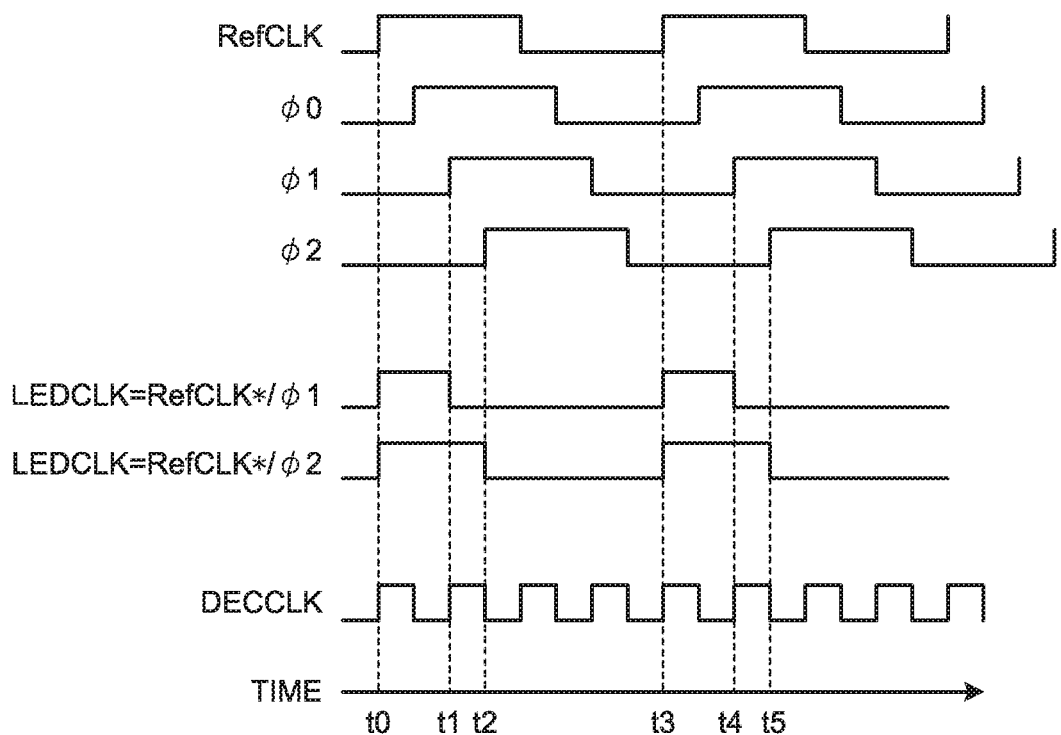

FIGS. 4A to 4C illustrate examples of generating the LED driving clock signal in the first embodiment. In FIGS. 4A to 4C the LED driving clock signal LEDCLK is generated from the delay signal φ1 or delay signal φ2 by way of example.

FIG. 4A illustrates an exemplary configuration of a logic circuit for generating the LED driving clock signal LEDCLK from the delay signal φ1. The logic circuit 60 includes a NOT circuit 61 with an input terminal that receives the delay signal φ1, and an AND circuit 62 with two input terminals, one of which is connected to the output terminal of the NOT circuit 61, and the other of which receives the reference clock signal RefCLK. The AND circuit 62 outputs the LED driving clock signal LEDCLK.

At time t0, the reference clock signal RefCLK turns to an H-level and the inversion signal /φ1 of the delay signal φ1 is at an H-level. That is, the LED driving clock signal LEDCLK being the output of the AND circuit 62 also turns to an H-level.

At time t1, the delay signal φ1 turns to an H-level, and then the inversion signal /φ1 of the delay signal φ1 turns to an L-level. That is, the LED driving clock signal LEDCLK being the output of the AND circuit 62 also turns to an L-level.

In this way, in the case of generating the LED driving clock signal LEDCLK from the delay signal φ1, the LED driving clock signal LEDCLK is output to the LED 43 for a period corresponding to one cycle of the decoder clock signal DECCLK, to cause the LED 43 to emit light.

FIG. 4B illustrates an exemplary configuration of a logic circuit that generates the LED driving clock signal LEDCLK from the delay signal φ2. A logic circuit 60 includes a NOT circuit 61 with an input terminal that receives the delay signal φ2, and an AND circuit 62 with two input terminals, one of which is connected to the output terminal of the NOT circuit 61, and the other of which receives the reference clock signal RefCLK. The AND circuit 62 outputs the LED driving clock signal LEDCLK.

At time t0, the reference clock signal RefCLK turns to an H-level, and the inversion signal /φ2 of the delay signal φ2 is at an H-level. Thus, the LED driving clock signal LEDCLK being the output of the AND circuit 62 also turns to an H-level.

At time t2, the delay signal φ2 turns to an H-level, and then the inversion signal /φ2 of the delay signal φ2 turns to an L-level. Thus, the LED driving clock signal LEDCLK being the output of the AND circuit 62 also turns to an L-level.

In this way, in the case of generating the LED driving clock signal LEDCLK using the delay signal φ2, the LED driving clock signal LEDCLK is output to the LED 43 for a period corresponding to 1.5 cycles of the decoder clock signal DECCLK, to cause the LED 43 to emit light.

Similarly, to generate the LED driving clock signal LED-CLK from the delay signal φ0 or delay signal φ4, the LED driving clock signal LEDCLK is output to the LED 43 for a period corresponding to 0.5 cycle of the decoder clock signal DECCLK, to cause the LED 43 to emit light. The LED driving clock signal LEDCLK with a lowest duty is thus generated. In terms of power consumption, it is preferable to use an LED driving clock signal LEDCLK with a lowest duty cycle, among transmissible LED driving clock signals LEDCLK.

The LED driving clock signal LEDCLK is generated using the delay signal φ3 or the delay signal φ7 in the same manner as using the reference clock signal RefCLK. In view of power consumption, thus, the delay signals are not to be used.

According to the first embodiment, as described above, the LED driving clock signal LEDCLK is generated using the edges of the reference clock signal RefCLK and one of the delay signals φ0 to φ2 and the delay signals φ4 to φ6 that are generated by delaying the reference clock signal RefCLK. Herein, the initial transition edge of the reference clock signal RefCLK, i.e., the initial rising edge in the embodiment, is used to generate the LED driving clock signal LEDCLK. This makes it possible to transmit the LED driving clock signal LEDCLK free from the influence of jitter in the frequency multiplier circuit 48 of the LED 43, to the primary circuit 21, with less power consumption.

Second Embodiment

The following will describe an operation according to a second embodiment. In the second embodiment, the frequency multiplier circuit 48 multiplies a half frequency divided signal of the reference clock signal RefCLK by eight to generate the decoder clock signal DECCLK, by way of example.

Figure 5:
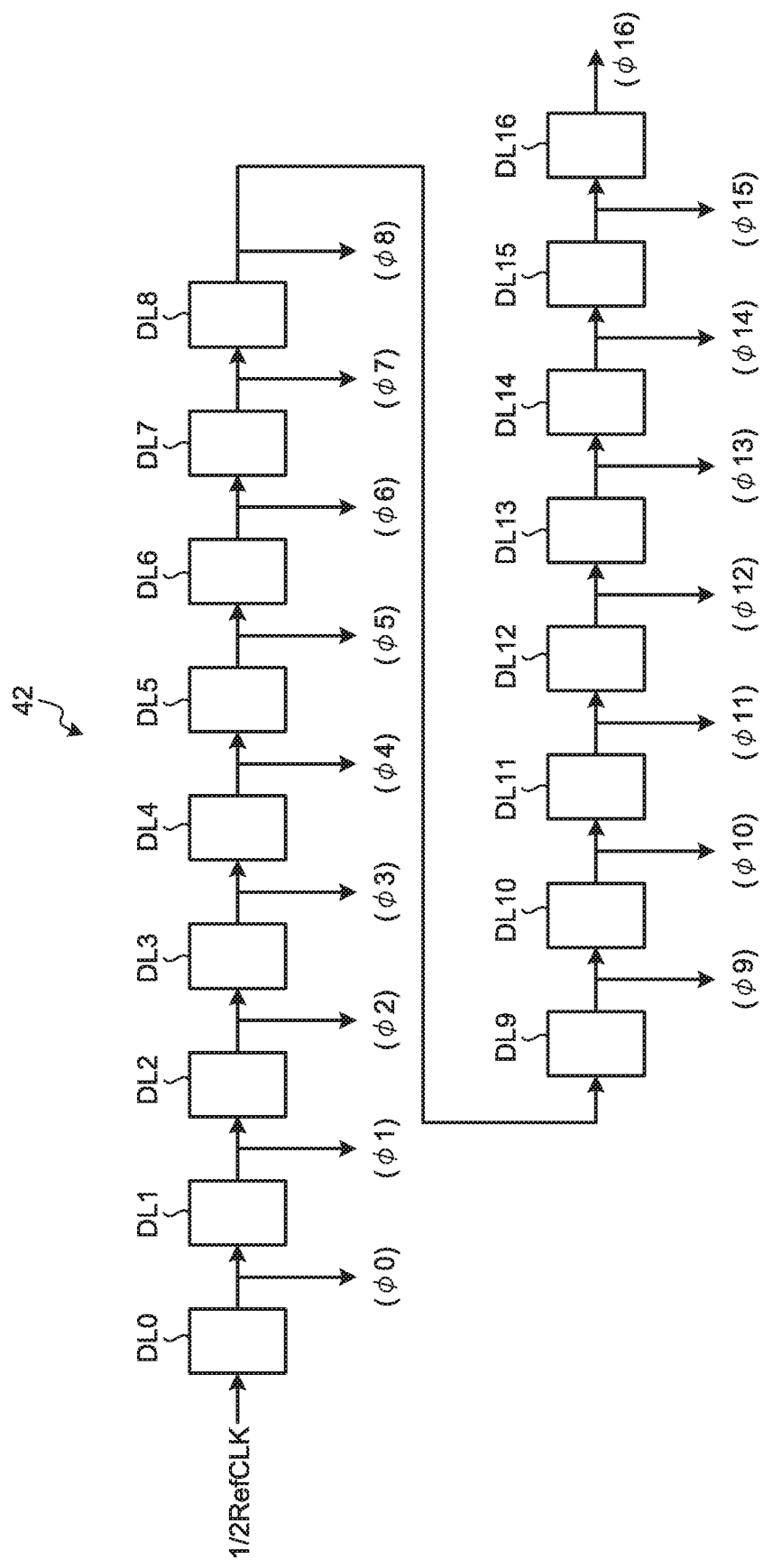
FIG. 5 is a function diagram of a clock generator circuit according to a second embodiment.

FIG. 5 is a function diagram of a clock generator circuit according to the second embodiment. The clock generator circuit 42 includes delay circuits DL0 to DL16, each of which receives the reference clock signal RefCLK and applies thereto amount of delay corresponding to timing between the rising edge and falling edge of the decoder clock signal DECCLK. The delay circuits DL0 to DL16 output delay signals φ0 to φ16, respectively.

Figure 6A:
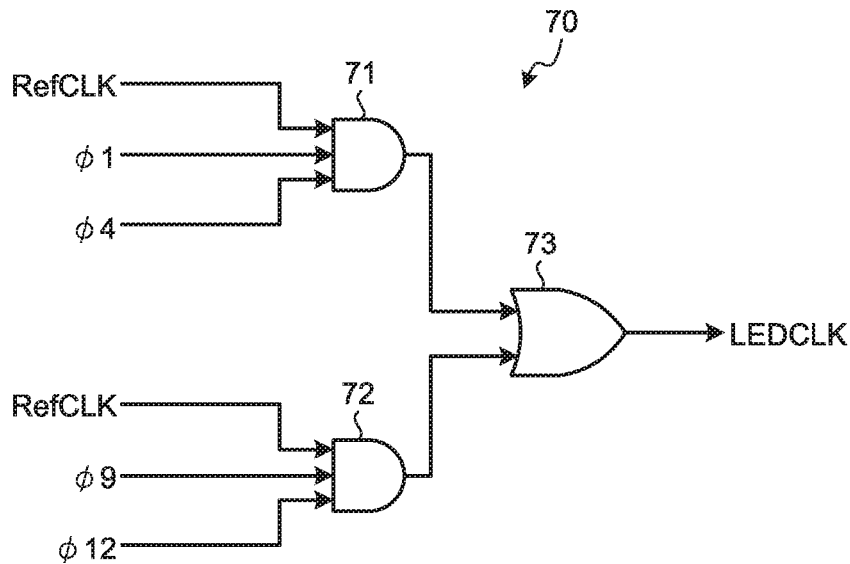
FIGS. 6A to 6C illustrates generation of an LED driving clock signal in the second embodiment, by way of example.
Figure 6B:
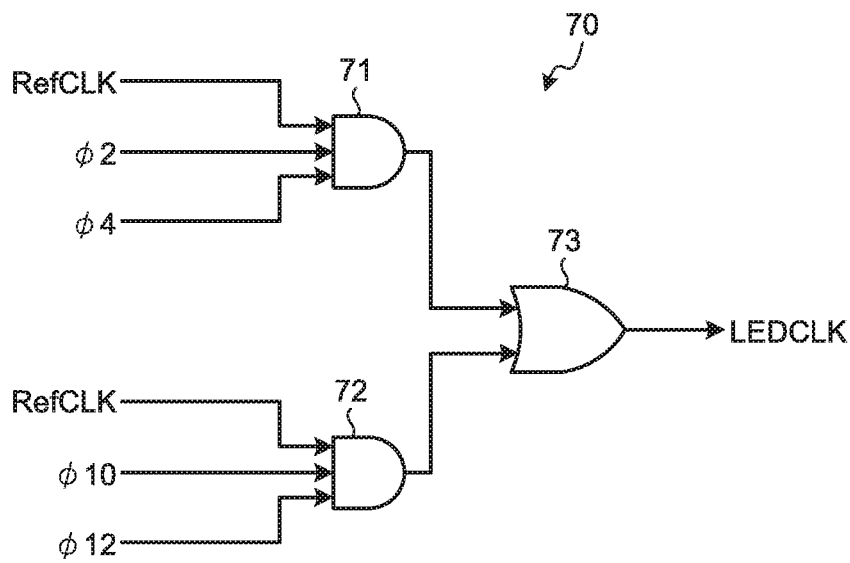
Figure 6C:
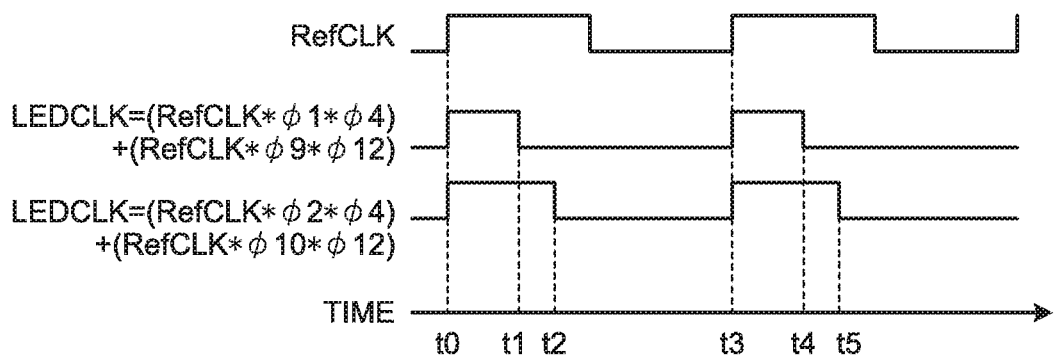

FIGS. 6A to 6C illustrate examples of generating the LED driving clock signal in the second embodiment. FIG. 6A illustrates an exemplary configuration of a logic circuit that generates the LED driving clock signal LEDCLK using the delay signal φ1, the delay signal φ4, the delay signal φ9, and the delay signal φ12.

The logic circuit 70 includes a first AND circuit 71, a second AND circuit 72, and an OR circuit 73.

The first AND circuit 71 has three input terminals that receive the delay signal φ1, the delay signal φ4, and the reference clock signal RefCLK, respectively. The first AND circuit 71 calculates a logical product of the signals, and outputs it to the OR circuit 73.

The second AND circuit 72 has three input terminals that receive the delay signal φ9, the delay signal φ12, and the reference clock signal RefCLK, respectively. The second AND circuit 72 calculates a logical product of the respective signals, and outputs it to the OR circuit 73.

The OR circuit 73 has two input terminals, one of which is connected to the output terminal of the first AND circuit 71, and the other of which is connected to the output terminal of the second AND circuit 72. The OR circuit 73 calculates a logical sum of the output of the first AND circuit 71 and the output of second AND circuit 72, and outputs the logical sum as the LED driving clock signal LEDCLK.

FIG. 7 is a signal timing chart at the time of generating the LED driving clock signal. As illustrated in FIG. 7, at time t0, the reference clock signal RefCLK turns to an H-level, the delay signal φ1 is at an L-level, and the delay signal φ4 is at an L-level. Thus, the output of the first AND circuit 71 is at an L-level.

Meanwhile, at time t0 the delay signal φ9 is at an H-level and the delay signal φ12 is at an H-level. Thus, the output of second AND circuit 72 is at an H-level. As illustrated in FIG. 6C, thus, the LED driving clock signal LEDCLK being the output of the OR circuit 73 turns to an H-level.

At time t1, the delay signal φ1 turns to an H-level and the delay signal φ4 remains at the L-level. Thus, the output of the first AND circuit 71 still remains at the L-level.

Meanwhile, at time t1 the delay signal φ9 turns to an L-level and the delay signal φ12 remains at the H-level. Thus, the output of the second AND circuit 72 turns to an L-level. As illustrated in FIG. 6C, the LED driving clock signal LEDCLK being the output of the OR circuit 73 turns to an L-level.

In this way, in the case of generating the LED driving clock signal LEDCLK from the delay signal φ1, the delay signal φ4, the delay signal φ9, and the delay signal φ12, the LED driving clock signal LEDCLK is output to the LED 43 for a period corresponding to one cycle of the decoder clock signal DECCLK, to cause the LED 43 to emit light.

FIG. 6B illustrates an exemplary configuration of a logic circuit that generates the LED driving clock signal LEDCLK from the delay signal φ2, the delay signal φ4, the delay signal φ10, and the delay signal φ12. The logic circuit 70 includes a first AND circuit 71, a second AND circuit 72, and an OR circuit 73. The first AND circuit 71 has three input terminals that receive the delay signal φ2, the delay signal φ4, and the reference clock signal RefCLK, respectively. The second AND circuit 72 has three input terminals that receive the delay signal φ10, the delay signal φ12, and the reference clock signal RefCLK. The OR circuit 73 has two input terminals, one of which is connected to the output terminal of the first AND circuit 71, and the other of which is connected to the output terminal of the second AND circuit 72. The OR circuit 73 outputs the LED driving clock signal LEDCLK.

As illustrated in FIG. 7, at time t0, the reference clock signal RefCLK turns to an H-level while the delay signal φ2 is at an L-level and the delay signal φ4 is at an L-level. Thus, the output of the first AND circuit 71 turns to an L-level.

Meanwhile, at time t0 the delay signal φ10 is at an H-level and the delay signal φ12 is at an H-level. Thus, the output of second AND circuit 72 turns to an H-level. As illustrated in FIG. 6C, hence, the LED driving clock signal LEDCLK being the output of the OR circuit 73 turns to an H-level.

At time t2, the delay signal φ2 turns to an H-level, and the delay signal φ4 remains at the L-level. That is, the output of the first AND circuit 71 still remains at the L-level.

Meanwhile, at time t2 the delay signal φ10 turns to an L-level while the delay signal φ12 remains at the H-level. Thus, the output of the second AND circuit 72 turns to an L-level. As illustrated in FIG. 6C, the LED driving clock signal LEDCLK being the output of the OR circuit 73 turns to an L-level.

In this way, in the case of generating the LED driving clock signal LEDCLK using the delay signal φ2, the delay signal φ4, the delay signal φ10, and the delay signal φ12, the LED driving clock signal LEDCLK is output to the LED 43 for a period corresponding to 1.5 cycles of the decoder clock signal DECCLK, to cause the LED 43 to emit light.

Similarly, in the case of generating the LED driving clock signal LEDCLK using the delay signal φ0, the delay signal φ4, the delay signal φ8, and the delay signal φ12, the LED driving clock signal LEDCLK is output to the LED 43 for a period corresponding to 0.5 cycle of the decoder clock signal DECCLK, to cause the LED 43 to emit light. That is, the LED driving clock signal LEDCLK with a lowest duty is generated.

Similarly, in the case of generating the LED driving clock signal LEDCLK from the delay signal φ3, the delay signal φ4, the delay signal φ1, and the delay signal φ12, the LED driving clock signal LEDCLK is output to the LED 43 for a period corresponding to 2.0 cycles of the decoder clock signal DECCLK, to cause the LED 43 to emit light. That is, the LED driving clock signal LEDCLK with a lowest duty is generated.

In view of power consumption, it is preferable to use a LED driving clock signal LEDCLK with a lowest duty cycle, among transmissible LED driving clock signals LEDCLK.

The above embodiment has presented a combination of delay signals and a logic circuit only by way of example. Other combinations are also feasible.

According to the second embodiment, as described above, the LED driving clock signal LEDCLK is generated using a suitable combination of the edges of the half divided frequency signal ½RefCLK of the reference clock signal RefCLK and the delay signals φ0 to φ16 that are generated by delaying the half divided frequency signal ½RefCLK. This makes it possible to transmit, to the primary circuit 21, the LED driving clock signal LEDCLK not affected by jitter in the frequency multiplier circuit 48 of the LED 43, with less power consumption.

Third Embodiment

The above embodiments have not specifically described selection of an LED driving clock signal LEDCLK having a lowest duty cycle at which the LED driver 44 is actually operable. A third embodiment will describe an example of automatically selecting such an LED driving clock signal LEDCLK having a lowest duty cycle.

The following description will refer to FIGS. 4A to 4C again for the sake of better understanding. In this case, a selector (not illustrated) is provided to select one of the delay signals φ0 to φ7 to be able to automatically input the delay signal to the input terminal of the NOT circuit 61 of the logic circuit as illustrated in FIG. 4A.

FIG. 8 is a flowchart of processing according to the third embodiment. First, the selector selects one of the delay signals φ0 to φ7 so as to set the lowest duty cycle, and inputs the selected delay signal to the input terminal of the NOT circuit 61 (step S11). In this example, in the initial state the delay signal φ0 is input to the input terminal of the NOT circuit 61.

As a result, the clock generator circuit 42 generates the LED driving clock signal LEDCLK to drive the LED driver 44 to transmit the LED driving clock signal LEDCLK to the primary circuit (step S12).

The clock recovery circuit 33 then recovers the reference clock signal RefCLK with reference to the LED driving clock signal LEDCLK with the lowest duty cycle, enabling the primary circuit 21 to transmit response data corresponding to a result of sensing the sensing-target device 11. The secondary circuit is to receive the response data within a given length of time.

In view of this, the controller 13 determines whether to have received response data within a given length of time (step S13). Receipt of the response data within the given length of time determined in step S13 (Yes at step S13) signifies that the duty cycle set at the time of this determination can be regarded as a lowest duty cycle at which the LED driver 44 is operable. The controller 13 maintains this duty cycle for performing communication.

No receipt of the response data within the given length of time determined in step S13 (No at step S13) signifies that the set duty cycle at the time of this determination does not allow the LED driver 44 to operate. Thus, the selector selects one of the delay signals to set a higher duty cycle by one (step S14), and inputs the selected delay signal to the input terminal of the NOT circuit 61, returning to step S12.

According to the third embodiment, as described above, it is possible to automatically set the LED driving clock signal LEDCLK with a lowest duty cycle at which the LED driver is operable, and to facilitate reduction in power consumption.

Modification of Embodiment

The above embodiments have not specifically described the relationship between the reference clock signal RefCLK and power consumption. With a fixed delay time between the reference clock signal RefCLK and the delay signal φ0, as the reference clock signal RefCLK lowers in frequency, the LED driving clock signal LEDCLK lowers in duty cycle, thereby improving current consumption reducing effects.

While certain embodiments have been described, these embodiments have been presented by way of example only, and are not intended to limit the scope of the invention. Indeed, these novel embodiments described herein may be embodied in a variety of other forms; furthermore, various omissions, substitutions and changes may be made without departing from the spirit of the invention. The accompanying claims and their equivalents are intended to cover such embodiments and the modifications thereof as would fall within the scope and spirit of the invention.

What is claimed is:

1. LED drive control circuitry that outputs an LED drive control signal serving to drive a light emitting diode included in a photocoupler, the photocoupler that performs insulation communication in synchronization with a reference clock signal, the LED drive control circuitry comprising:
   a duty cycle changer that lowers a mean of duty cycles of the LED drive control signal in accordance with the reference clock signal and a signal synchronized with the reference clock signal.

2. The LED drive control circuitry according to claim 1, wherein the signal synchronized with the reference clock signal includes a plurality of delay signals generated by sequentially delaying the reference clock signal by a given length of time.

3. Electronic circuitry comprising:
   a photocoupler comprising a light emitting diode and a photodetector;
   a first signal processing circuit; and
   a second signal processing circuit, the electronic circuitry that performs insulation communication between the first signal processing circuit and the second signal processing circuit through the photocoupler, the circuitry further comprising a duty cycle changer that lowers a mean of duty cycles of an LED drive control signal in accordance with a reference clock signal and a signal synchronized with the reference clock signal, the LED drive control signal serving to drive the light emitting diode.

4. The electronic circuit according to claim 3, wherein the duty cycle changer is configured to use, as the signal synchronized with the reference clock signal, a plurality of delay signals generated by sequentially delaying the reference clock signal by a given length of time.

5. An LED drive control method for driving a light emitting diode included in a photocoupler, the photocoupler that performs insulation communication in synchronization with a reference clock signal, the method comprising:

generating a signal synchronized with the reference clock signal; and lowering a mean of duty cycles of an LED drive control signal in accordance with the reference clock signal and a signal synchronized with the reference clock signal, the LED drive control signal serving to drive the light emitting diode.

6. The LED drive control method according to claim 5, wherein the generating a signal synchronized with the reference clock signal comprises generating a plurality of delay signals as the signal synchronized with the reference clock signal by sequentially delaying the reference clock signal by a given length of time.

* * * * *